(12) United States Patent
Asamura

(10) Patent No.: US 8,941,444 B2
(45) Date of Patent: Jan. 27, 2015

(54) CRYSTAL OSCILLATOR

(75) Inventor: Fumio Asamura, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 323 days.

(21) Appl. No.: 13/341,213

(22) Filed: Dec. 30, 2011

(65) Prior Publication Data

US 2012/0176763 A1    Jul. 12, 2012

(30) Foreign Application Priority Data

Jan. 6, 2011   (JP) ................................ 2011-001335
May 20, 2011   (JP) ................................ 2011-113716

(51) Int. Cl.
*H03B 5/32*     (2006.01)
*H03B 5/36*     (2006.01)
*H03L 1/02*     (2006.01)
*H03L 1/04*     (2006.01)

(52) U.S. Cl.
CPC .... *H03B 5/364* (2013.01); *H03B 5/36* (2013.01); *H03L 1/028* (2013.01); *H03L 1/022* (2013.01); *H03L 1/04* (2013.01)
USPC ................... 331/158; 331/108 C; 331/116 R; 331/116 FE; 331/68

(58) Field of Classification Search
USPC ....... 331/158, 116 R, 116 FE, 175, 108 C, 68
See application file for complete search history.

(56) References Cited

U.S. PATENT DOCUMENTS 8,299,864 B2 * 10/2012 Tanaka .......................... 331/158
2006/0176121 A1   8/2006 Satoh

FOREIGN PATENT DOCUMENTS

JP        2005-026828 A    1/2005

* cited by examiner

*Primary Examiner* — Arnold Kinkead
(74) *Attorney, Agent, or Firm* — Knobbe Martens Olson & Bear LLP

(57) ABSTRACT

A crystal oscillator is configured by accommodating a crystal blank that functions as a crystal unit and an IC chip that includes at least an oscillator circuit using the crystal blank into a container in an integrated manner. In the IC chip, the oscillator circuit is connected to the crystal unit via a pair of crystal connecting terminals, an output from the oscillator circuit is supplied to a plurality of output buffers. In relation to the crystal connecting terminal having a phase opposite to that of an output from the on/off controllable output buffer, an output terminal of this output buffer is disposed farther than an output terminal of the output buffer that is not subjected to the on/off control.

5 Claims, 4 Drawing Sheets

CRYSTAL OSCILLATOR

BACKGROUND OF THE INVENTION

1. Field of the Invention

The present invention relates to a quartz crystal oscillator that includes a quartz crystal unit and an IC (integrated circuit) chip integrating an oscillator circuit using the crystal unit in one component, and more specifically, to a crystal oscillator with improved stability of oscillation frequency.

2. Description of the Related Arts

The crystal oscillator configured by combining the crystal unit and the IC chip integrating the oscillator circuit using the crystal unit into a single package component can easily adopt a surface mount configuration, and is widely incorporated as a reference source of frequency and time in a mobile electronic device, for instance, typified by a mobile phone.

In the crystal oscillator, the electronic circuit integrated in the IC chip is not limited to an oscillator circuit. Instead, for instance, an electronic circuit, such as a temperature compensating circuit, can be integrated into the IC chip. The temperature compensating circuit compensates temperature-frequency characteristics of the crystal unit and allows a constant oscillation frequency to be acquired irrespective of the ambient temperature. A crystal oscillator capable of highly accurately maintaining the oscillation frequency by integrating a temperature compensating circuit in the IC chip is referred to as a temperature compensated crystal oscillator (TCXO).

FIG. 1 shows an example of a circuit configuration of a TCXO.

The TCXO shown in the diagram includes: crystal unit 10; and IC chip 20 including an oscillator circuit using crystal unit 10. For instance, a crystal unit employing an AT-cut quartz crystal blank can be adopted as crystal unit 10. IC chip 20 includes: constant voltage circuit 21 that is supplied with a power supply voltage from the outside and in turn supplies a regulated internal power supply voltage to each circuit in IC chip 20; oscillator circuit 22 connected with crystal unit 10; frequency controller 23 that is supplied with an automatic frequency control (AFC) signal from the outside, generates a frequency control signal and supplies this signal to oscillator circuit 22; temperature sensor 24 that measures temperature; temperature compensating circuit 25 that generates a temperature compensating signal for compensating temperature-frequency characteristics of crystal unit 10 according to the measurement result of temperature by temperature sensor 24, and supplies this signal to oscillator circuit 22; nonvolatile memory 26 that stores data used for generating the temperature compensating signal; and output buffers 27 and 28 that amplify an oscillation output from oscillator circuit 22 and supply the output as an analog signal to external circuits. Output buffers 27 and 28 are arranged in parallel. Output buffer 28 thereof is capable of turning on and off according to an enable signal supplied from the outside. In consideration of a case of incorporating the TCXO into an electronic device having a wireless communication function, a continuous oscillation output signal from output buffer 27 is adopted as a reference signal for a PLL (phase-locked loop) synthesizer circuit in a wireless section, and further adopted as clocks for a DSP (digital signal processor) and a CPU (central processing unit) for system control. On the other hand, output buffer 28 is linked to an intermittent operation signal for the PLL circuit and allows on/off control of the output. An oscillation output signal from output buffer 28 is supplied to, for instance, circuits without need to operate during standby. By thus allowing the on/off control of the output from output buffer 28, power consumption of the electronic device with the crystal oscillator during standby is facilitated to be reduced.

Along with the above arrangement of circuits in IC chip 20, IC chip 20 includes: power supply terminal VDD to which power supply voltage is supplied; ground terminal GND; pair of crystal connecting terminals X1 and X2 electrically connected with crystal unit 10; input terminal AFC to which an automatic frequency control signal is supplied; enable terminal EN to which an enable signal is supplied; and two output terminals OUT1 and OUT2 at which oscillation output signals from respective output buffers 27 and 28 appear. A Colpitts oscillator circuit including an inverting amplifier is widely used as oscillator circuit 22. Crystal connecting terminal X1 is electrically drawn from an input side of the amplifier, and crystal connecting terminal X2 is electrically drawn from an output side of the amplifier. Accordingly, along with an operation of oscillator circuit 22, the phases of signal components of oscillation frequencies appearing at respective crystal connecting terminals X1 and X2 are opposite to each other as shown in FIG. 1. Both inverting and non-inverting amplifiers are usable as output buffers 27 and 28. However, as shown in FIG. 1, in a case where non-inverting amplifiers are employed as output buffers 27 and 28, signal phases at output terminals OUT1 and OUT2 are identical to the signal phase at crystal connecting terminal X2.

In a case of providing two output buffers in the crystal oscillator, one may be configured by an inverting amplifier and the other may be configured by a non-inverting amplifier. JP2005-026828A describes a crystal oscillator that employs inverting and non-inverting amplifiers as output buffers and allows simultaneous on/off control of outputs from the two output buffers. A configuration for acquiring two oscillation output signals that have the identical frequency but have phases opposite to each other is described in, for instance, US 2006/0176121 A1. In the crystal oscillator described in US 2006/0176121 A1, first and second amplifiers, both of which are inverting amplifiers, are employed, a crystal unit is inserted between an input terminal of the first amplifier and an input terminal of the second amplifier, a load capacitor is inserted between the input or output terminal of each amplifier and a ground point, the output terminal of the first amplifier and the input terminal of the second amplifier are connected to each other via a first dc blocking capacitor, the input terminal of the first amplifier and the output terminal of the second amplifier are connected to each other via a second dc blocking capacitor, and a feedback resistor is provided for each amplifier, allowing oscillation output signals having phases opposite to each other from the respective first and second amplifiers to be acquired.

Incidentally, what is configured by hermetically encapsulating a quartz crystal blank in a container is a crystal unit. Accordingly, the crystal oscillator is configured as a package component by integrating a container and an IC chip; this integration is made by means of fixing the IC chip to the container of the crystal unit, hermetically encapsulating the crystal blank and the IC chip in the same container, or using a container including two housing portions to hermetically house the crystal blank at one portion and house the IC chip at the other portion for integration. Also in this case, electronic circuits such as an oscillator circuit using a crystal blank are integrated in the IC chip. The crystal blank is represented as crystal unit 10 in a circuit diagram representation as shown in FIG. 1.

SUMMARY OF THE INVENTION

Miniaturization of crystal oscillators has presently been advanced. What has outer dimensions of a package of 2 mm in length, 1.6 mm in width and 0.8 mm in height (i.e., thickness) has been put to practical use. In the miniaturized crystal oscillators there are concerns on adverse effects of an oscillation output signal acquired from an output buffer being leaked back to an oscillator circuit side. In particular, in a case where variation in load and on-and-off of an output from the output buffer itself varies the amplitude of an oscillation output signal on an output side of the output buffer, a leak amount of a signal component back to the oscillator circuit side varies accordingly. This variation may in turn cause variation in oscillation frequency. If the leak amount is continuously constant, circuit design in consideration of the leak amount allows a stable and highly accurate oscillation frequency to be acquired. However, in a case where variation in signal amplitude at the output side of the output buffer varies the amount of leak of the oscillation frequency component back to the oscillator circuit side, design allowing the variation is practically difficult. Accordingly, the variation in oscillation frequency cannot be ignored.

It is an object of the present invention to provide a crystal oscillator that includes a plurality of output buffer circuits, allows on/off control of an output from at least one output buffer circuit, and has a small variation in oscillation frequency in a case of performing on/off control of the output.

According to a first aspect of the present invention, a crystal oscillator is provided that includes: a crystal unit; and an IC chip in which at least an oscillator circuit using the crystal unit is integrated, the crystal unit and the oscillator circuit being housed in a container, wherein the IC chip includes: a plurality of output buffers that amplify an output from the oscillator circuit and output the amplified output to the outside; a pair of crystal connecting terminals that are used for electrical connection between the oscillator circuit and the crystal unit; and output terminals provided for the respective output buffers, signals of an oscillation frequency component appear at the pair of crystal connecting terminals with phases opposite to each other, each of the plurality of output buffers independently includes an inverting or non-inverting amplifier, at least one of the plurality of output buffers is an output buffer whose output is on/off controllable according to an enable signal, and the IC chip is configured such that, for each on/off controllable output buffer, in relation to the crystal connecting terminal having a phase opposite to that of the output of this output buffer, an output terminal of this output buffer is disposed farther than an output terminal of the other output buffer.

According to a second aspect of the present invention, a crystal oscillator is provided that includes: a crystal unit; and an IC chip in which at least an oscillator circuit using the crystal unit is integrated, the crystal unit and the oscillator circuit being housed in a container, wherein the IC chip includes: a plurality of output buffers that amplify an output from the oscillator circuit and output the amplified output to the outside; a pair of crystal connecting terminals that are used for electrical connection between the oscillator circuit and the crystal unit; and output terminals provided for the respective output buffers, signals of an oscillation frequency component appear at the pair of crystal connecting terminals with phases opposite to each other, each of the plurality of output buffers independently includes an inverting or non-inverting amplifier, at least one of the plurality of output buffers is an output buffer whose output is on/off controllable according to an enable signal, and the container is configured such that, for each on/off controllable output buffer, wiring is made such that a capacitance between the crystal connecting terminal having a phase opposite to that of the output of this output buffer and an output terminal of this output buffer is smaller than a capacitance between this output terminal and the other crystal connecting terminal.

The crystal oscillator according to the present invention adopts any of the aforementioned configurations. Then, leaking of the oscillation frequency component back to the oscillator circuit side is reduced, allowing variation in oscillation frequency along with on/off control of the output buffer to be suppressed.

DETAILED DESCRIPTION OF THE PREFERRED EMBODIMENTS

Figure 1:
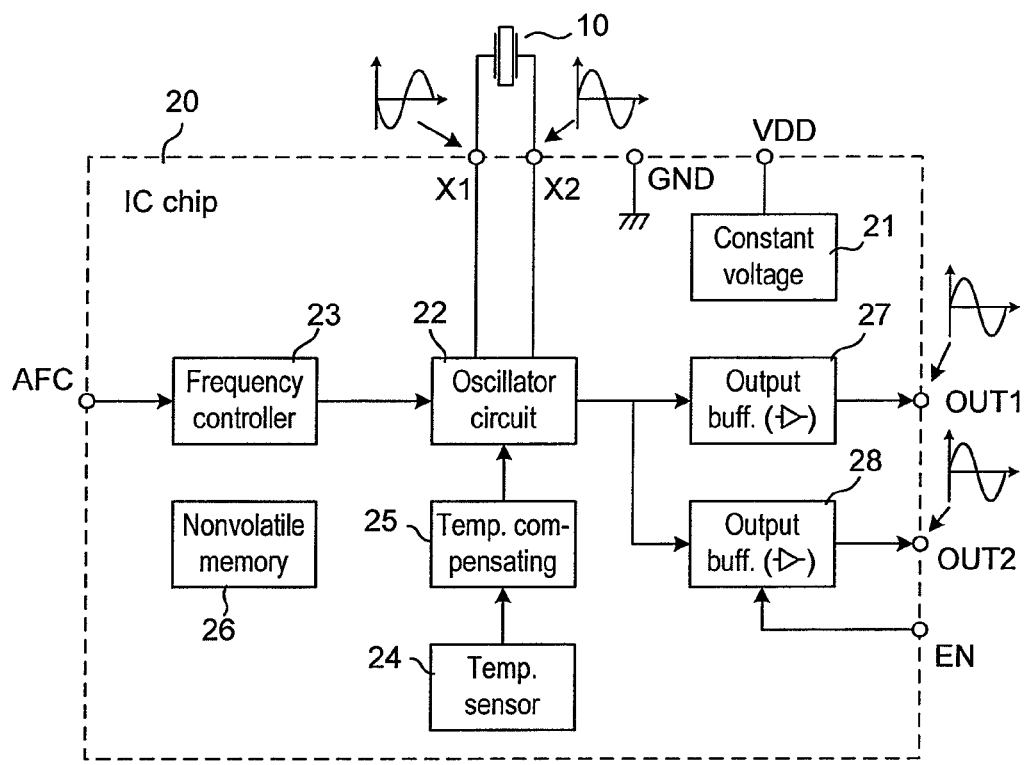
FIG. 1 is a block diagram showing an example of a circuit configuration of a temperature compensated crystal oscillator (TCXO) of a related art.

In the figures with which description will be made below, parts and elements identical to those in FIG. 1 are assigned with identical reference numerals, and description thereof is simplified or omitted.

Figure 2:
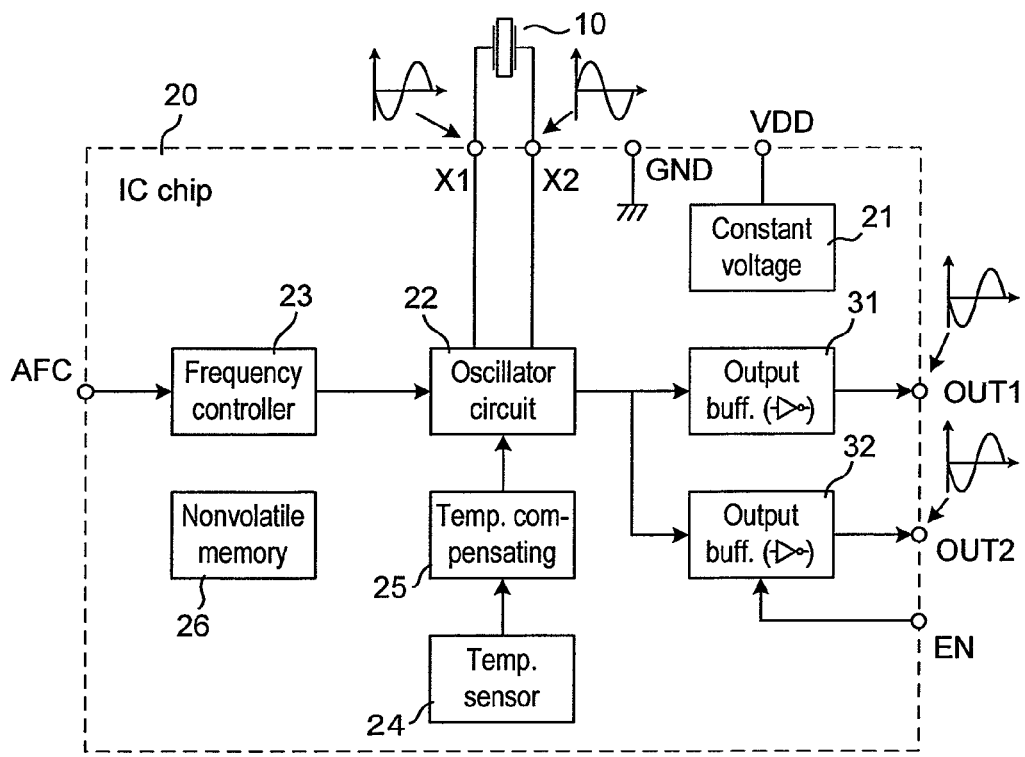
FIG. 2 is a block diagram showing a circuit configuration of a crystal oscillator according to an embodiment of the present invention.

A quartz crystal oscillator according to an embodiment of the present invention shown in FIG. 2 is configured as a TCXO, as with that shown in FIG. 1. This oscillator is configured by integrating crystal unit 10 and IC chip 20 into a package component. For instance, a crystal unit using an AT-cut quartz crystal blank is employed as crystal unit 10. Various configurations can be used for integrating crystal unit 10 and IC chip 20. These configurations may be: a configuration in which a package including an IC chip is attached to a crystal unit which is configured by encapsulating a crystal blank in a container body; a configuration hermetically encapsulating a crystal blank, which functions as a crystal blank, together with an IC chip in one recess provided in a container made of a laminated ceramic or the like; and a configuration in which two recesses are provided with a container body made of a laminated ceramic or the like, a crystal blank is hermetically encapsulated in one recess to configure a crystal unit, and an IC chip is housed in the other recess. An example of a configuration of integrating crystal unit 10 and IC chip 20 in this embodiment will be described later in detail.

As with the case shown in FIG. 1, IC chip 20 includes constant voltage circuit 21, oscillator circuit 22, frequency controller 23, temperature sensor 24, temperature compensating circuit 25, and nonvolatile memory 26. In addition, IC chip 20 is provided with output buffers 31 and 32 both including an inverting amplifier, as output buffers that amplify an oscillation output from oscillator circuit 22 and supply the amplified output as an analog signal to an external circuit. Output buffers 31 and 32 are arranged in parallel with respect to an output from oscillator circuit 22. One of them, or output buffer 32, can be subjected to on/off control of the output according to an external enable signal. Along with the arrangement of these circuits in IC chip 20, IC chip 20 includes: power supply terminal VDD; ground terminal GND; a pair of crystal connecting terminals X1 and X2 electrically connected with crystal unit 10; input terminal AFC to which an automatic frequency control signal is supplied; enable terminal EN; and two output terminals OUT1 and OUT2 at which oscillation output signal from respective output buffers 31 and 32 appear. The crystal connecting terminals, the power supply terminal, the ground terminal, the input terminal, the enable terminal and the output terminals in IC chip 20 are collectively referred to as IC terminals.

It is assumed that, in the crystal oscillator of the present embodiment, the plurally provided output buffers, which are two output buffers in the example shown here, include an output buffer subjected to on/off control of the output. The crystal oscillator is configured such that variation in amplitude of an oscillation output signal on the output side of the output buffer due to on/off control does not adversely affect the oscillator circuit side as much as possible. It is considered that the adverse effect of variation in amplitude of the oscillation output signal back to the oscillator circuit side is caused by leaking of the oscillation output signal to the oscillator circuit side. Thus, a configuration of the present embodiment to prevent the oscillation output signal from being leaked back to the oscillator circuit side as much as possible will be described with reference to FIG. 3. A circuit diagram shown in FIG. 3 indicates a part including crystal unit 10, oscillator circuit 22 and output buffers 31 and 32 in the crystal oscillator of the present embodiment, as a part enclosed by alternate long and short dashed lines. A load circuit to be connected to the crystal oscillator and a switch for generating the enable signal are not shown in FIG. 3.

Oscillator circuit 22 includes: inverting amplifier 51; feedback resistor R1 of amplifier 51; two variable-capacitance diodes D1 and D2 functioning as load capacitances; two resistors R2 and R3 for applying control voltage Vc to variable-capacitance diodes D1 and D2, respectively; and dc blocking capacitors C1 and C2. Feedback resistor R1 is provided between an input terminal and an output terminal of amplifier 51. Both ends of crystal unit 10 are connected to the input and output terminals of amplifier 51 via crystal connecting terminals X1 and X2, respectively. The input terminal of amplifier 51 is connected to one end of dc blocking capacitance C1. The other end of dc blocking capacitance C1 is connected to one end of resistor R2 and the cathode of variable-capacitance diode D1. The output terminal of amplifier 51 is connected to one end of dc blocking capacitance C2 and input terminals of output buffers 31 and 32. The other end of dc blocking capacitance C2 is connected to one end of resistor R3 and the cathode of variable-capacitance diode D2. Here, in the circuit shown in FIG. 2, control voltage Vc collectively indicates a frequency control signal supplied from frequency controller 23 to oscillator circuit 22 and a temperature compensating signal supplied from temperature compensating circuit 25 to oscillator circuit 22. This voltage is supplied to the other ends of resistors R2 and R3 in common. The anodes of variable-capacitance diodes D1 and D2 are grounded.

Figure 3:
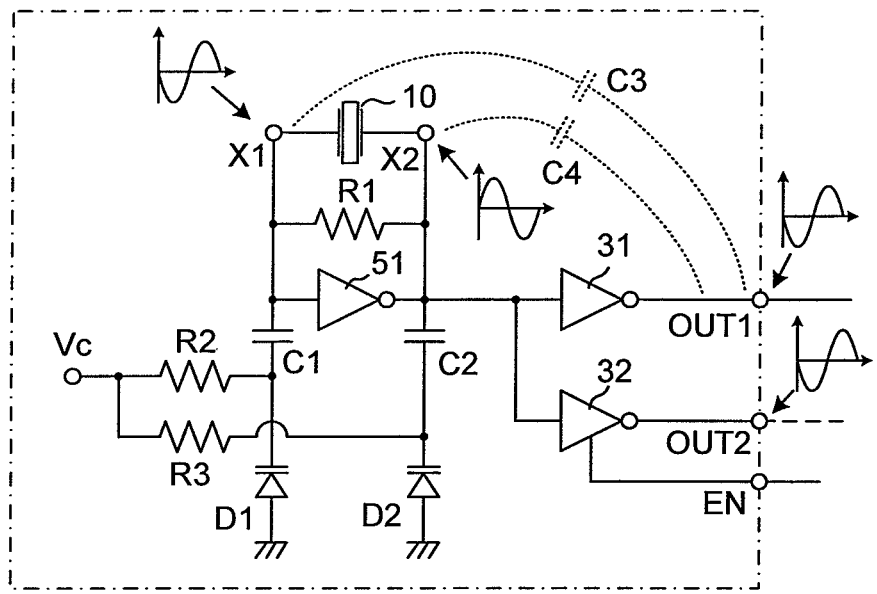
FIG. 3 is a circuit diagram illustrating a principle of suppressing variation in oscillation frequency.

In FIG. 3, output buffers 31 and 32 are indicated by circuit symbols of inverting amplifiers. The output of output buffer 31 is connected to an external circuit. The output of output buffer 32 is also supplied to the external circuit via output terminal OUT2 of IC chip 20. A switch is provided between enable terminal EN of IC chip 20 and a ground potential point. An enable signal turns on and off, thereby allowing on/off control of output buffer 32.

Leaking of the oscillation output signal back to the oscillator circuit side will be discussed. For connection from the oscillator circuit to crystal unit 10, in the crystal oscillator, two wiring paths respectively extend from crystal connecting terminals X1 and X2 of IC chip 20 to crystal unit 10. Likewise, since the outputs from output buffers 31 and 32 are supplied to external circuits, the wiring paths for connection to the external circuits are connected to respective output terminals OUT1 and OUT2 from output buffers 31 and 32. In a case of configuring the crystal oscillator by integrating a crystal blank as a crystal unit and IC chip 20 in the same container, the wiring paths are formed in the container. For each output buffer, parasitic capacitances C3 and C4 as indicated by broken lines in the diagram are generated between the two wiring paths connected to crystal connecting terminals X1 and X2 and the output side of the output buffer. Here, the output side of the output buffer means the output terminal of the output buffer and the wiring path connected to the output terminal. Parasitic capacitance C3 is formed between the wiring path connected to crystal connecting terminal X1 and the output side of the output buffer. Parasitic capacitance C4 is formed between the wiring path connected to crystal connecting terminal X2 and the output side of the output buffer. The leaking of the oscillation output signal from the output side of the output buffer back to the oscillator circuit can be considered as a leakage of the oscillation output signal through the parasitic capacitances C3 and C4.

As shown in FIG. 3, in the oscillator circuit employing inverting amplifier 51, the wiring path connected to crystal connecting terminal X1 and the wiring path connected to crystal connecting terminal X2 have phases opposite to each other with respect to a signal component of the oscillation frequency. Since, it has been assumed that an inverting amplifier is used as output buffer, relationship between the wiring path connected to crystal connecting terminal X2, that is, the input side of the output buffer, and the output side of the output buffer also have phases opposite to each other with respect to the signal component of the oscillation frequency. In general, the leakage of the oscillation output signal through the parasitic capacitance is small if the both ends of the parasitic capacitance have the same phase, and large if these ends have the opposite phases, according to relationship of temporal change in potential difference between both ends of the capacitance. In the case shown in FIG. 3, since the inverting amplifier is employed as the output buffer, the amount of leaking of the oscillation output signal via parasitic capacitance C4 is larger than the amount of leaking of the oscillation output signal via parasitic capacitance C3. If the same amount of signal is leaked back to each of the input and output terminals of amplifier 51 of the oscillator circuit, the input terminal having higher impedance is more susceptible to the adverse effect. However, the circuit shown in FIGS. 2 and 3 is not susceptible to the oscillation output signal leaked back to amplifier 51 because the phase is identical to that of the signal at the input terminal of amplifier 51. In conclusion, in order to suppress the adverse effect of variation in amplitude of the oscillation output signal due to on/off control of the output buffer, it is sufficient that the value of parasitic capacitance C4 for output buffer 32 on which on/off control is performed is small.

Thus, the crystal oscillator according to the present embodiment specifies that, since IC chip 20 is housed in or fixed to the container, the capacitance between the crystal connecting terminal of IC chip 20 and the output terminal of IC chip 20 is defined as parasitic capacitance generated between the crystal connecting terminal (or the wiring path connected to this crystal connecting terminal) and the output terminal (or another wiring path connected to this output terminal). Attention is paid to output buffer 32, which is subjected to on/off control, of two output buffers 31 and 32; it is provided that capacitance between crystal connecting terminal X2 having a phase opposite to that of the output from the output buffer 32 and output terminal OUT2 connected to output buffer 32 is parasitic capacitance on the opposite phase side, and capacitance between the other crystal connecting terminal X1, that is, the crystal connecting terminal on the same phase side, and output terminal OUT2 is parasitic capacitance on the same phase side. The crystal oscillator of the present invention allows the parasitic capacitance on the opposite phase side to be smaller than the parasitic capacitance on the same phase side. In actuality, for instance, arrangement of the wiring paths and the ground potential portion in the container enables the parasitic capacitance on the opposite phase side to be smaller than the parasitic capacitance on the same phase side.

In a strict sense, it is required to consider leaking due to parasitic capacitance of wiring lines from the circuits in IC chip 20 to crystal connecting terminals X1 and X2 and output terminals OUT1 and OUT2 provided on the same main surface of IC chip 20. However, since the lengths of the wiring lines are much smaller than those of the wiring paths provided on the container and connected to crystal connecting terminals X1 and X2 and output terminals OUT1 and OUT2, the effect of the leaking due to these wiring lines can be ignored.

Figure 4:
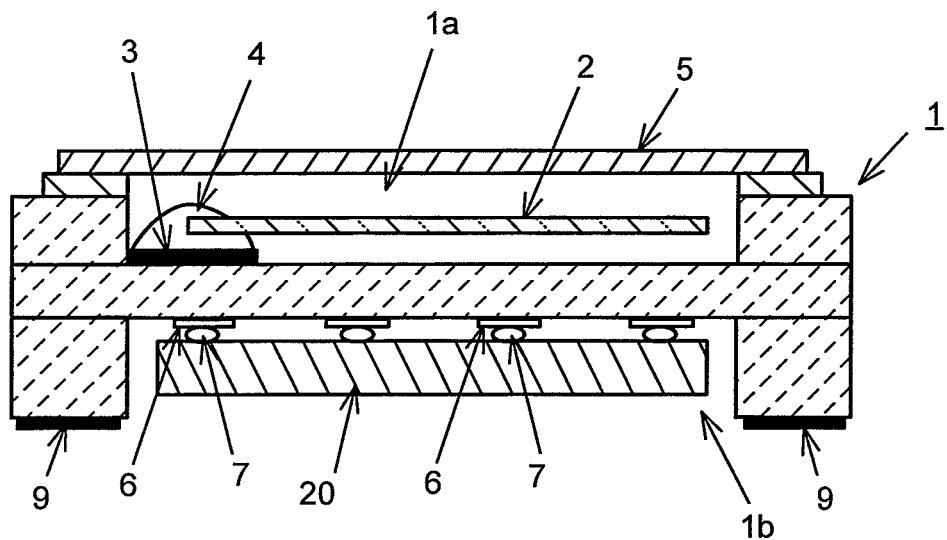
FIG. 4 is a sectional view showing an example of a structure of the crystal oscillator.
Figure 5:
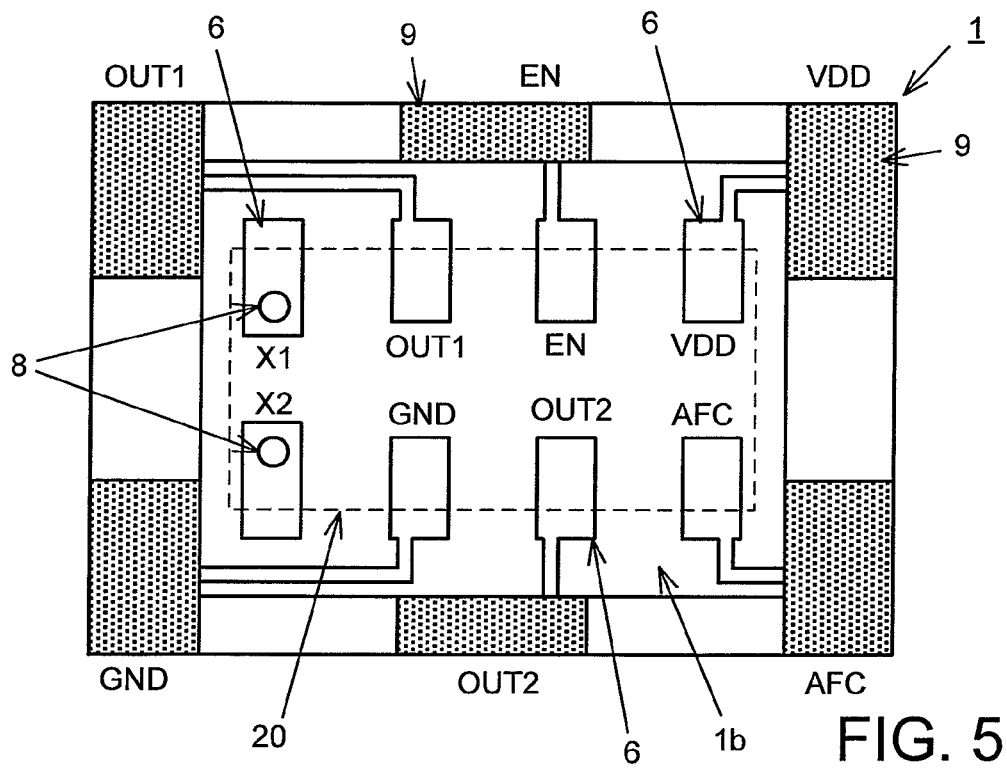
FIG. 5 is a bottom view of the crystal oscillator shown in FIG. 4 in a state where an IC chip is removed.

FIGS. 4 and 5 shows an example of a configuration of a crystal oscillator in which the wiring path of the parasitic capacitance on the opposite phase side is smaller than the parasitic capacitance on the same phase side. The crystal oscillator is configured as a surface mount type suitable for surface mounting on a circuit board or a wiring board. The crystal oscillator includes container body 1, which has a shape of a flat and substantially rectangular parallelepiped. Recesses 1a and 1b are formed on respective main surfaces of container body 1. One recess 1a houses crystal blank 2, which corresponds to crystal unit 10 in the description on FIGS. 2 and 3. Recess 1a is covered with lid member 5, thereby hermetically encapsulating crystal blank 2 in recess 1a. Crystal blank 2 may be, for instance, a substantially rectangular AT-cut quartz crystal blank, and includes respective excitation electrodes, not shown, at both main surfaces. Leading electrodes extend from the respective excitation electrodes toward both sides of one end of crystal blank 2. The both sides of the one end of crystal blank 2, toward which the respective leading electrodes extend, are fixed to holding terminal 3 provided on the bottom of one recess 1a of container body 1 by conductive adhesive 4.

Mounting electrodes 9, which are used for surface-mounting the crystal oscillator on a circuit board or the like, are provided on the end surface surrounding other recess 1b of container body 1. In this example, as shown in FIG. 5, mounting electrodes 9 for power supply (VDD), ground (GND), input of AFC signal (AFC) and first oscillation output (OUT1) are formed at four corners of the end surface. Mounting electrodes 9 for enable signal (EN) and second oscillation output (OUT2) are formed at central parts of the pair of long sides of container body 1.

Aforementioned IC chip 20 is housed in other recess 1b. In IC chip 20, the electronic circuit including the oscillator circuit is formed on one main surface of a semiconductor substrate. Accordingly, this main surface is referred to as a circuit formation plane. The IC terminals are provided on the circuit formation plane. Connection electrodes (i.e., pads) 6 are provided on the bottom surface of recess 1b corresponding to the respective IC terminals. IC chip 20 is fixed to the bottom surface of recess 1b by flip-chip bonding using bumps 7. At this time, the corresponding IC terminals and connection electrodes 6 are electrically and mechanically connected to each other by bumps 7. Connection electrodes 6 corresponding to crystal connecting terminals X1 and X2 among the IC terminals are electrically connected to holding terminals 3 on the bottom surface of recess 1a by conductive paths that are formed in container body 1 and include via-holes 8. Crystal blank 2 is thus electrically connected to the oscillator circuit and the like in IC chip 20. Connection electrode 6 corresponding to power supply terminal VDD, ground terminal GND, output terminals OUT1 and OUT2, input terminal AFC and enable terminal EN among the IC terminals are connected to respective mounting electrodes 9 via conductive paths provided in container body 1.

In this embodiment, the magnitude of parasitic capacitance is considered. Therefore, the wiring path connected to the output terminal of IC chip 20 includes bump 7 electrically connected to the output terminal, connection electrode 6, and mounting electrode 9, and the conductive path therebetween. Likewise, the wiring path connected to the crystal connecting terminal of IC chip 20 includes bump 7 electrically connected to this crystal connecting terminal, connection electrode 6, holding terminal 3 and conductive adhesive 4, and a conductive path (including via-hole 8) therebetween. In the example shown in FIG. 5, what has a phase opposite to that of the output from output buffer 32 subjected to on/off control is crystal connecting terminal X2. The wiring path connected to crystal connecting terminal X2 includes connection electrode 6 indicated by reference symbol X2 in FIG. 5 and via-hole 8 connected thereto. The wiring path connected to the output terminal of output buffer 32 subjected to on/off control includes connection electrode 6 indicated by reference symbol OUT2 and mounting electrode 9, and the conductive path connecting them. The wiring path connected to the other crystal connecting terminal X1 includes connection electrode 6 indicated by reference symbol X1 in FIG. 5 and via-hole 8 connected thereto.

In the example shown in FIG. 5, since connection electrode 6, which is to be ground potential GND, is arranged between connection electrode 6 indicated by reference symbol X2 and connection electrode 6 indicated by reference symbol OUT2, the capacitance between output terminal OUT2 and crystal connecting terminal X2 is smaller than the capacitance between output terminal OUT2 and crystal connecting terminal X1. This makes effects of on/off control of the output from output buffer 32 difficult to be exerted on the side of oscillator circuit 22, and prevents the oscillation frequency from varying.

According to the example shown in FIG. 5, in container body 1, connection electrode 6 for grounding is disposed between connection electrode 6 for output terminal OUT2 and connection electrode 6 for crystal connecting terminal X2. Thus, according to the configuration of the wiring path in the container, the capacitance between output terminal OUT2 and crystal connecting terminal X2 having phases opposite to each other is smaller than the capacitance between output terminal OUT2 and crystal connecting terminal X1 having a phase identical to each other. However, leaking of the oscillation output signal from the output side of the output buffer to the oscillator circuit can also be suppressed by arrangement of the IC terminals in the IC chip. The shapes and the like of the output terminals in IC chip 20 are not largely different from each other among the respective output buffers. Also in the container, the shapes of connection electrodes 6 are analogous to each other. In consideration of capacitance between two wiring paths, contribution of a part where both wiring paths are close to each other is large. Accordingly, in container body 1, what most contributes to the capacitance between the output terminal and the crystal connecting terminal is a region where IC chip 20 is mounted on the container. The fact that the region where the IC chip is mounted on the container most contributes to the capacitance is not limited to the case of the crystal oscillator where container body 1 shown in FIGS. 4 and 5 is used, crystal blank 2 is hermetically encapsulated in recess 1a provided on one main surface of container body 1, and IC chip 20 is housed in recess 1b provided on the other main surface. Instead, the fact is entirely applicable to cases of general crystal oscillators integrating a crystal unit and an IC chip into a container or a package.

Accordingly, whatever the configuration of integrating crystal unit 10 and IC chip 20 is, crystal connecting terminals X1 and X2 of IC chip 20 can represent wiring paths connecting respective crystal connecting terminals X1 and X2 with crystal unit 10, and output terminals OUT1 and OUT2 of IC chip 20 can represent wiring paths connected to respective output terminals OUT1 and OUT2, thereby allowing the capacitance to be considered on the basis of the distance between thus represented wiring paths. An example will hereinafter be described where setting of mutual arrangement between crystal connecting terminals X1 and X2 and output terminals OUT1 and OUT in IC chip 20 suppresses that variation in amplitude of the oscillation output signal due to on/off control of the output buffer adversely affects the oscillator circuit.

In the crystal oscillator shown in FIG. 2, the output terminal of output buffer 32 of the output buffers 31 and 32 that is subjected to on/off control according to the enable signal is disposed farther than the output terminal of output buffer 31 in relation to crystal connecting terminal X2. As a result, in comparison with a case where the output buffer subjected to the on/off control is disposed nearer than the output buffer not subjected to the on/off control in relation to crystal connecting terminal X2, the side of oscillator circuit 22 becomes resistant to being affected by the on/off operation of the output buffer, allowing variation of the oscillation frequency to be prevented.

That is, according to the present embodiment, in the case where the plurality of output buffers of the inverting type are provided and some of them are on/off controllable output buffers, in relation to crystal connecting terminal X2, which is the crystal connecting terminal having a phase opposite to that of the output terminal of the output buffer, the output terminal of the on/off controllable output buffer is disposed further than the output terminal of the output buffer not to be subjected to on/off control. Even though the phase is identical to that of the output from the output buffer, it is preferable to reduce the effect of being leaked back to crystal connecting terminal X1. Accordingly, in this case, also in relation to crystal connecting terminal X1, it is preferable to satisfy a condition that the output terminal of the on/off controllable output buffer is disposed farther than the output terminal of the output buffer not subjected to on/off control.

In a case where a plurality of output buffers of the non-inverting type are provided as the plurality of output buffers and some of them are used as on/off controllable output buffers, it is sufficient that the output terminal of the on/off controllable output buffer is disposed farther than the output terminal of the output buffer not subjected to on/off control in relation to crystal connecting terminal X1, which is a crystal connecting terminal having a phase opposite to that of the output terminal of the output buffer. In this case, it is preferable to further satisfy a condition that the output terminal of the on/off controllable output buffer is disposed farther than the output terminal of the output buffer not subjected to on/off control also in relation to crystal connecting terminal X2.

The crystal oscillator according to the present invention is not limited to the case of adopting the non-inverting amplifier not subjected to on/off control and the on/off controllable inverting amplifier as output buffers provided in IC chip 20. Hereinafter, a crystal oscillator different from FIG. 2 in presence or absence of on/off control of the output buffers and combination of inverting and non-inverting types will be described.

Figure 6:
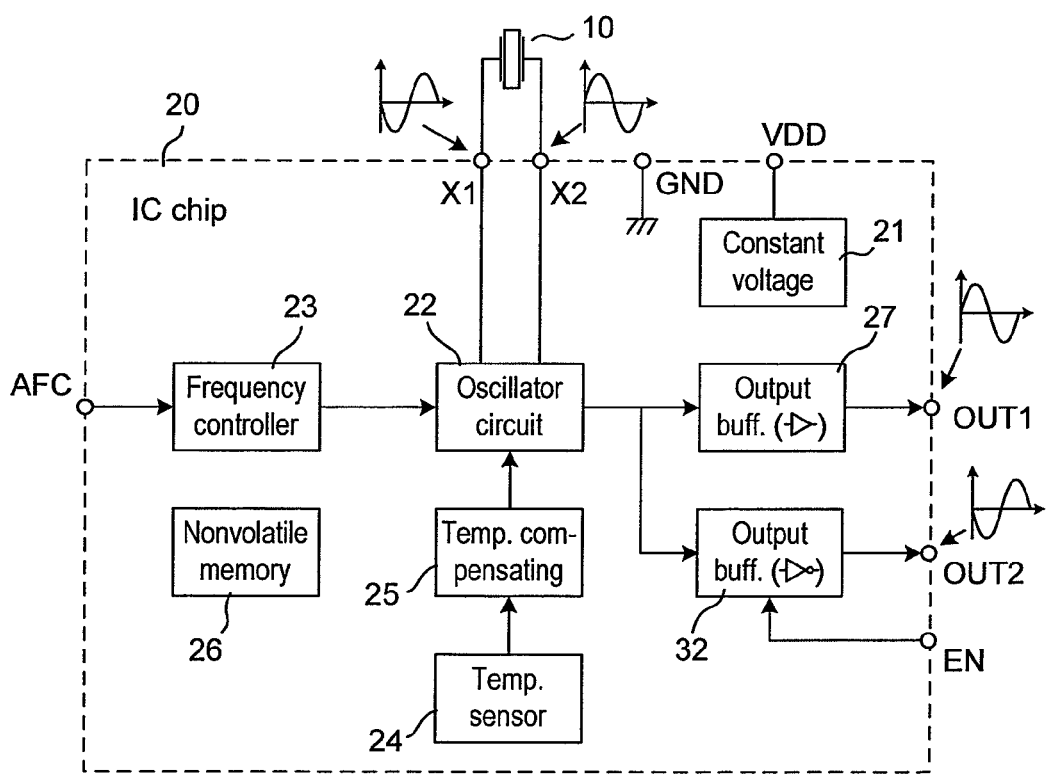
FIG. 6 is a block diagram showing a circuit configuration of a crystal oscillator according to another embodiment of the present invention.

In the configuration shown in FIG. 2, instead of output buffer 31 that is not subjected to on/off control and includes inverting amplifier, output buffer 27 including a non-inverting amplifier can be employed as shown in FIG. 6. In the crystal oscillator shown in FIG. 6, output buffer 27 is not subjected to on/off control, and outputs an oscillation output signal to output terminal OUT1. In this configuration, in relation to a crystal connecting terminal having a phase opposite to that of the output from output buffer 32 subjected to on/off control, that is, in relation to crystal connecting terminal X2 in the case shown in FIG. 6, output terminal OUT2 of output buffer 32 subjected to on/off control is disposed farther than output terminal OUT1 of output buffer 27 not subjected to on/off control. Alternatively, wiring path are configured in a container such that the capacitance between output terminal OUT2 and crystal connecting terminal X2 is smaller than the capacitance between output terminal OUT2 and crystal connecting terminal X1. Such a configuration also allows variation in oscillation frequency along with on/off control of the output from the output buffer to be suppressed. This configuration includes output buffer 27 having the non-inverting amplifier and output buffer 32 employing inverting amplifier. Oscillation output signals having phases opposite to each other can be acquired.

Figure 7:
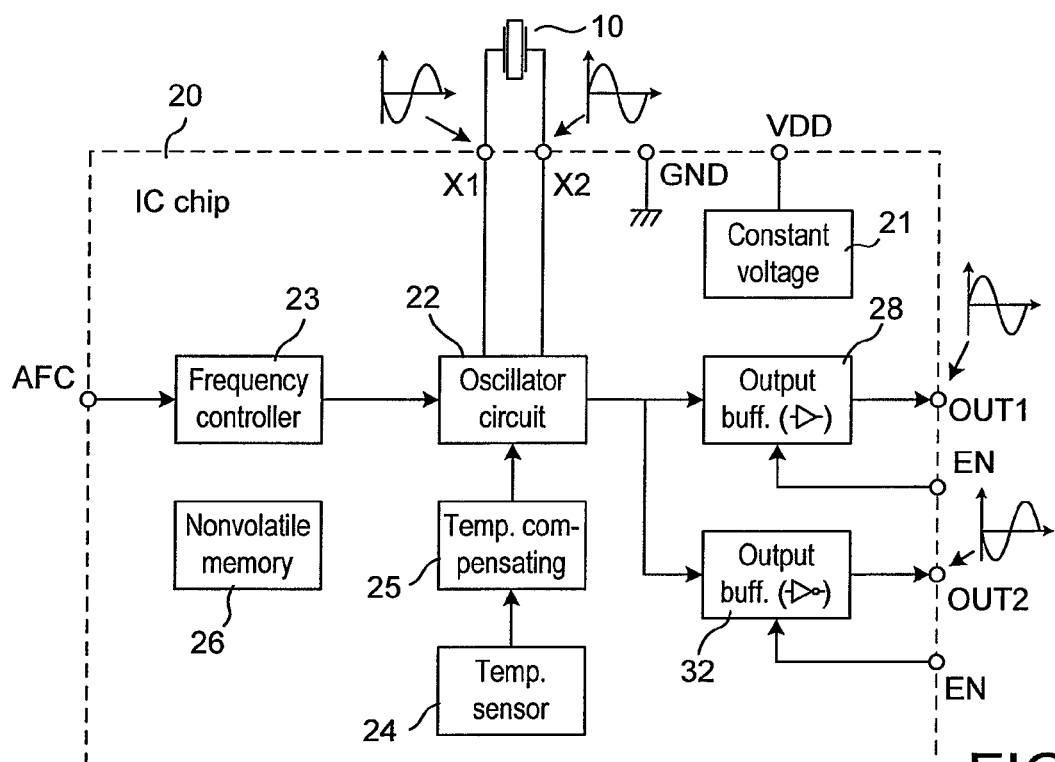
FIG. 7 is a block diagram showing a circuit configuration of a crystal oscillator according to a further embodiment of the present invention.

A crystal oscillator shown in FIG. 7 has a configuration according to that of the crystal oscillator shown in FIG. 2 where output buffer 31 including the inverting amplifier not subjected to on/off control is replaced with output buffer 28 including a non-inverting amplifier subjected to on/off control. An oscillation output signal is supplied from output buffer 28 to output terminal OUT1. In order to input an enable signal for on/off control of the output from output buffer 28, enable terminal EN for output buffer 28 is provided in IC chip 20. Output buffers 28 and 32 are capable of independent on/off control of outputs.

In this crystal oscillator, one of crystal connecting terminals X1 and X2 that has a phase opposite to that of the output of output buffer 28 is crystal connecting terminal X1. What has a phase opposite to that of the output from output buffer 32 is crystal connecting terminal X2. Thus, the output terminal of output buffer 28 is disposed farther than the output terminal of the other output buffer, that is, output buffer 32 in this case, in relation to crystal connecting terminal X1; the output terminal of output buffer 32 is disposed farther than the output terminal of the other output buffer, that is, output buffer 28 in this case, in relation to crystal connecting terminal X2. Alternately, wiring paths in the container is configured such that the capacitance between output terminal OUT1 of output buffer 28 and crystal connecting terminal X1 is smaller than the capacitance between output terminal OUT1 and crystal connecting terminal X2, and the capacitance between output terminal OUT2 of output buffer 32 and crystal connecting terminal X2 is smaller than the capacitance of output terminal OUT2 and crystal connecting terminal X1. Accordingly, with respect to the wiring path connected to each crystal connecting terminal, the amount of leaking on the output side of the output buffer having a phase opposite to that of the wiring path is reduced, allowing variation in oscillation frequency along with on/off control of the output buffer to be suppressed.

In the crystal oscillators according to the aforementioned respective embodiments of the present invention, as the output buffer whose output can be subjected to on/off control according to the enable signal, for instance, a buffer that includes an analog switch circuit controlled by the enable signal and is subjected to on/off control of the output of an oscillation output signal by means of on/off control of the analog switch circuit, or a buffer where on/off control of power supply to the amplifier according to the enable signal in turn controls the output of the oscillation output signal, can be adopted.

What is claimed is:

1. A crystal oscillator, comprising: a crystal unit; and an IC chip that integrates at least an oscillator circuit using said crystal unit, said crystal unit and said oscillator circuit being housed in a container,
   wherein said IC chip includes: a plurality of output buffers that amplify an output from said oscillator circuit and output the amplified output to outside; a pair of crystal connecting terminals that are used for electrical connection between said oscillator circuit and said crystal unit; and output terminals provided for said respective output buffers,
   signals of an oscillation frequency component appear at said pair of crystal connecting terminals with phases opposite to each other,
   each of said plurality of output buffers independently includes an inverting or non-inverting amplifier,
   at least one of said plurality of output buffers is an output buffer whose output is on/off controllable according to an enable signal, and
   said container is configured such that, for each on/off controllable output buffer, wiring is made such that a capacitance between said crystal connecting terminal having a phase opposite to that of the output of said each on/off controllable output buffer and an output terminal of said each on/off controllable output buffer is smaller than a capacitance between the output terminal of said each on/off controllable output buffer and the other crystal connecting terminal.

2. The crystal oscillator according to claim 1, wherein the number of said output buffers is two.

3. The crystal oscillator according to claim 2, wherein said oscillator circuit includes an amplifier of an inverting type, an input terminal and an output terminal of the amplifier of said oscillator circuit are connected with said pair of crystal connecting terminals, respectively, and only one of said output buffers is on/off controllable output buffer.

4. The crystal oscillator according to claim 1, wherein the on/off control is performed by controlling a power supply of said on/off controllable output buffer according to the enable signal.

5. The crystal oscillator according to claim 1, said on/off controllable output buffer includes an analog switch controlled by the enable signal and performs the on/off control by the analog switch.

* * * * *